(12) United States Patent
Nelson et al.

(10) Patent No.: US 8,125,785 B2
(45) Date of Patent: Feb. 28, 2012

(54) ANGLED DOORS WITH CONTINUOUS SEAL

(75) Inventors: Michael J. Nelson, Prior Lake, MN (US); Michael J. Wayman, Waconia, MN (US); Kevin Thompson, Chaska, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 931 days.

(21) Appl. No.: 12/137,307

(22) Filed: Jun. 11, 2008

(65) Prior Publication Data
US 2009/0309467 A1    Dec. 17, 2009

(51) Int. Cl.
H05K 5/00    (2006.01)
(52) U.S. Cl. .............. 361/730; 361/752; 361/800
(58) Field of Classification Search .......... 361/730, 361/752, 796, 797, 800, 816, 818
See application file for complete search history.

(56) References Cited

U.S. PATENT DOCUMENTS

| | | | |
|---|---|---|---|
| 1,683,793 A | 9/1928 | Nyman | |
| 2,226,615 A | 12/1940 | Killen | |
| 2,259,185 A | 10/1941 | Swedman | |
| 2,704,688 A | 3/1955 | Adell | |
| 2,723,896 A | 11/1955 | Wurtz | |
| 2,740,658 A | 4/1956 | Kesich | |
| 3,014,158 A | 12/1961 | Nelson | |
| 3,126,589 A | 3/1964 | Monti | |
| 3,138,833 A | 6/1964 | Neuman | |
| 3,371,447 A | 3/1968 | Ruff | |
| 3,501,866 A | 3/1970 | Johnson | |
| 3,837,120 A | 9/1974 | Hanks | |
| 3,894,767 A | 7/1975 | Schatzler | |
| 4,114,065 A | 9/1978 | Horvay | |
| 4,820,885 A | 4/1989 | Lindsay | |
| 4,861,077 A | 8/1989 | Welkey | |
| 4,862,324 A | 8/1989 | Kalvaitis | |
| 4,994,315 A | 2/1991 | Schreiber | |
| 5,274,731 A | 12/1993 | White | |
| 5,309,680 A | 5/1994 | Kiel | |
| 5,465,528 A | 11/1995 | Schinzel et al. | |
| 5,548,085 A | 8/1996 | Flores | |
| 5,713,647 A * | 2/1998 | Kim ......................... | 312/223.2 |
| 6,065,612 A | 5/2000 | Rinderer | |
| 6,082,441 A | 7/2000 | Boehmer et al. | |
| 6,116,615 A | 9/2000 | Trehan | |
| 6,142,595 A | 11/2000 | Dellapi et al. | |
| 6,158,832 A | 12/2000 | Costa | |

(Continued)

*Primary Examiner* — Hung S Bui
(74) *Attorney, Agent, or Firm* — Fogg & Powers LLC

(57) ABSTRACT

In one embodiment, an electronics enclosure is provided. The electronics enclosure comprises a base operable to secure one or more electronic components in place. The base comprises a back wall to which the electronic components are secured; a first end plate extending from a first end of the back wall; and a second end plate extending from a second end of the back wall. The electronics enclosure further comprises a first side wall coupled to a first side of the base and operable to rotate between an open position and a closed position; a second side wall coupled to a second side of the base and operable to rotate between an open position and a closed position; and wherein each of the first and second side walls comprise a first section and a second section which form an angle such that, when in the closed position, the first and second side walls interconnect with each other and together abut the exposed perimeter of the first end plate, the second end plate and the back wall to enclose the one or more electronic components.

34 Claims, 13 Drawing Sheets

U.S. PATENT DOCUMENTS

| | | |
|---|---|---|
| 6,238,027 B1 | 5/2001 | Kohler et al. |
| 6,299,008 B1 | 10/2001 | Payne |
| 6,350,000 B1 | 2/2002 | Van Benthem |
| 6,384,323 B2 | 5/2002 | Elm |
| 6,564,428 B2 | 5/2003 | Richard |
| 6,788,535 B2 * | 9/2004 | Dodgen et al. ................. 361/695 |
| 6,968,647 B2 | 11/2005 | Levesque et al. |
| 7,068,516 B2 * | 6/2006 | Chan et al. ..................... 361/731 |
| 7,225,586 B2 | 6/2007 | Levesque et al. |
| 7,450,382 B1 * | 11/2008 | Fischer et al. ................. 361/695 |
| 2002/0125799 A1 | 9/2002 | Landsberger |
| 2002/0130598 A1 | 9/2002 | Schmidt |
| 2003/0099101 A1 | 5/2003 | Skrepcinski |
| 2003/0102141 A1 | 6/2003 | Schneider |
| 2004/0114326 A1 | 6/2004 | Dodgen |
| 2007/0247809 A1 | 10/2007 | McClure |
| 2008/0031585 A1 | 2/2008 | Solheid |
| 2008/0318631 A1 * | 12/2008 | Baldwin et al. ............ 455/562.1 |
| 2009/0102140 A1 | 4/2009 | Deaver |
| 2009/0307983 A1 | 12/2009 | Nelson |
| 2009/0309467 A1 | 12/2009 | Nelson |

\* cited by examiner

ANGLED DOORS WITH CONTINUOUS SEAL

CROSS-REFERENCE TO RELATED CASES

This application is related to the following co-pending U.S. patent applications filed on even date herewith, all of which are hereby incorporated herein by reference:

U.S. patent application Ser. No. 12/137,322 entitled "COMMUNICATION MODULES") and which is referred to here as the '322 Application;

U.S. patent application Ser. No. 12/137,297 entitled "APPARATUS FOR MOUNTING A MODULE AND ENABLING HEAT CONDUCTION FROM THE MODULE TO THE MOUNTING SURFACE") and which is referred to here as the '297 Application;

U.S. patent application Ser. No. 61/060,589 entitled "SUSPENSION METHOD FOR COMPLIANT THERMAL CONTACT OF ELECTRONICS MODULES") and which is referred to here as the '589 Application;

U.S. patent application Ser. No. 12/474,933 entitled "L-SHAPED DOOR WITH 3-SURFACE SEAL FOR ENDPLATES") and which is referred to here as the '933 Application;

U.S. patent application Ser. No. 61/060,576 entitled "L-SHAPED DOORS WITH TRAPEZOIDAL SEAL") and which is referred to here as the '576 Application;

U.S. patent application Ser. No. 12/137,309 entitled "VENTURI FAN-ASSISTED COOLING OF HEAT SINK") and which is referred to here as the '309 Application;

U.S. patent application Ser. No. 61/060,547 entitled "COMBINATION EXTRUDED AND CAST METAL OUTDOOR ELECTRONICS ENCLOSURE") and which is referred to here as the '547 Application;

U.S. patent application Ser. No. 61/060,584, entitled "SYSTEMS AND METHODS FOR CABLE MANAGEMENT" and which is referred to here as the '584 Application;

U.S. patent application Ser. No. 61/060,581 entitled "CAM SHAPED HINGES") and which is referred to here as the '581 Application;

U.S. patent application Ser. No. 12/137,313 entitled "SOLAR SHIELDS") and which is referred to here as the '313 Application;

U.S. patent application Ser. No. 61/060,501 entitled "APPARATUS AND METHOD FOR BLIND SLOTS FOR SELF DRILLING/SELF-TAPPING SCREWS") and which is referred to here as the '501 Application.

U.S. patent application Ser. No. 61/060,593 entitled "THERMAL MANAGEMENT") and which is referred to here as the '593 Application.

U.S. patent application Ser. No. 61/060,762 entitled "SERF BOARD COMPONENTS") and which is referred to here as the '762 Application.

U.S. patent application Ser. No. 61/060,740 entitled "PULL-OUT SHELF FOR USE IN A CONFINED SPACE FORMED IN A STRUCTURE") and which is referred to here as the '740 Application.

U.S. patent application Ser. No. 11/627,255, entitled "A DISTRIBUTED REMOTE BASE STATION SYSTEM" (the '829 Application).

U.S. patent application Ser. No. 11/627,251, entitled "MODULAR WIRELESS COMMUNICATIONS PLATFORM" (the '828 Application).

BACKGROUND

In a communications system, such as a distributed antenna system, it is often necessary to place a remote unit in an outdoor area. For example, a remote unit may be placed in an outdoor stadium, park, etc. Placing a remote unit outdoors potentially exposes the unit to adverse weather conditions, such as rain, wind, etc. In order to protect the electronic components of the remote unit, the electronic components are typically placed in an enclosure which is sealed and is water-resistant. While enclosures protect the electronic components, conventional enclosures also make it difficult to access the components during installation or maintenance by blocking or providing small access areas to one or more sides of the electronic components.

Therefore, for the reasons stated above and for other reasons which shall become apparent to one of ordinary skill in the art upon reading and studying the present application, there is a need in the art for an improved electronics enclosure which provides greater ease of access to electronic components contained therein.

SUMMARY

The above mentioned problems and other problems are resolved by the present invention and will be understood by reading and studying the following specification.

In one embodiment, an electronics enclosure is provided. The electronics enclosure comprises a base operable to secure one or more electronic components in place. The base comprises a back wall to which the electronic components are secured; a first end plate extending from a first end of the back wall; and a second end plate extending from a second end of the back wall. The electronics enclosure further comprises a first side wall coupled to a first side of the base and operable to rotate between an open position and a closed position; a second side wall coupled to a second side of the base and operable to rotate between an open position and a closed position; and wherein each of the first and second side walls comprise a first section and a second section which form an angle such that, when in the closed position, the first and second side walls interconnect with each other and together abut the exposed perimeter of the first end plate, the second end plate and the back wall to enclose the one or more electronic components.

DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

In accordance with common practice, the various described features are not drawn to scale but are drawn to emphasize specific features relevant to the present invention. Like reference numbers and designations in the various drawings indicate like elements.

DETAILED DESCRIPTION

Figure 1:
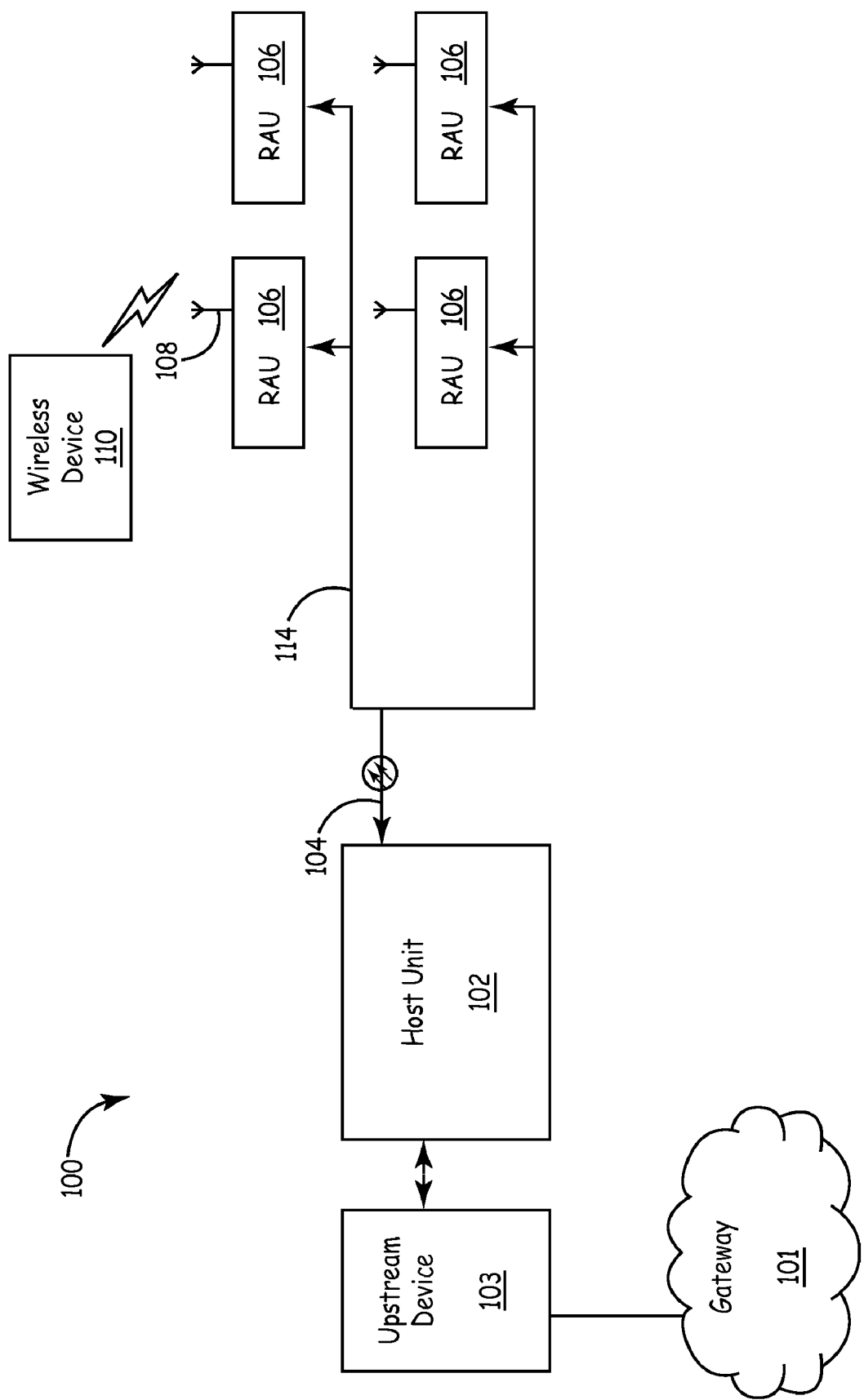
FIG. 1 is a block diagram of a distributed antenna system according to one embodiment of the present invention.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical, and electrical changes may be made without departing from the scope of the present invention. Furthermore, the method presented in the drawing figures or the specification is not to be construed as limiting the order in which the individual steps may be performed. The following detailed description is, therefore, not to be taken in a limiting sense.

Embodiments of the present invention are used in a modular wireless platform that enables a system facilitator to easily and inexpensively adapt their wireless system for use with different data transport mechanisms, frequency bands, communication technologies, and intelligence distribution. This modular platform is made up of a reconfigurable host unit and a reconfigurable remote unit designed for use in a system with a central node and a plurality of distributed antennas. The host unit is located near the central node and facilitates transmission/reception of information to/from the remote units which are located remotely with an accompanying antenna. The remote units function to transmit/receive transmissions from the host unit and transmit/receive wireless signals over accompanying antenna to mobile costumers.

The host unit and remote units have a modular design and defined interfaces that allow components to be removed and installed to adapt to the needs of the service providers. Both host and remote unit are designed around a serial communication module and have a defined interface where different varieties of conversion modules can be connected and disconnected. There are many different conversion modules, and each conversion module is designed for a particular technology and frequency band. Thus, technology and frequency band adjustments can be made by simply replacing the conversion module in the host unit or remote unit. One exemplary radio frequency (RF) module is described in the '1027 application. Additional details regarding an exemplary modular platform and distributed antenna system are described in the '828 and '829 applications.

Additionally, the host unit and remote units are designed to allow different transport mechanisms between the host unit and remote units. For example, the same host unit and remote units that use fiber optic for inter-unit transmission can be adapted to use millimeter wave (MMW) wireless transmission, such as E band communications, instead of or concurrently with the fiber optic. Finally, wireless processing functionality can be placed all on a base station near the central node, or the functionality can be distributed throughout each of the remote units. The flexibility to modify the functionality of each remote unit allows the wireless platform to support centralized base stations and distributed base stations, either separately or concurrently.

FIG. 1 is a block diagram of one embodiment of a system 100 using a modular wireless communications platform as described above. System 100 is a field configurable distributed antenna system (DAS) that provides bidirectional transport of a portion of RF spectrum from an a network gateway 101 to a plurality of remote antennas 108. In this embodiment network 101 is implemented as an Internet Protocol (IP) gateway. However, it is to be understood that network gateway 101 can be implemented for use with other technologies including, but not limited to, a Public Switched Telephone Network (PSTN), a Global System for Mobile communications (GSM) network, a Universal Mobile Telecommunications System (UMTS) network, etc. Along with IP gateway 101 and the plurality of remote antennas 108, system 100 includes a upstream device 103 (such as base station transceivers or wireless access points or other sources of radio frequency signals), a host unit 102, a transport mechanism 104, and a plurality of remote units 106 (labeled RAU in FIG. 1). Host unit 102, a modular host transceiver, is communicatively coupled to remote units 106, modular remote radio heads. Notably, although only four remote units 106 are shown in this example, for purposes of explanation, other numbers of remote units 106 can be used in other embodiments. In particular, in some embodiments, host unit 102 supports up to eight remote units 106.

Host unit 102 and remote units 106 work together to transmit and receive data to/from remote antennas 108. In this embodiment, host unit 102 provides the interface between base station 103 and signal transport mechanism 104. Each of remote units 106 provides the interface between transport mechanism 104 and a remote antenna 108. In this embodiment, signal transport mechanism 104 is an optical fiber, and host unit 102 sends optical signals through the optical fiber to remote units 106. In other embodiments, the signal transport mechanism 104 can be implemented as a wireless connection as described above. Additional suitable implementations of transport mechanism 104 include, but are not limited to, thin coaxial cabling or CATV cabling where multiple RF frequency bands are distributed or lower-bandwidth cabling, such as unshielded twisted-pair cabling, for example, where only a single RF frequency band is distributed.

During transmission, base station 103 performs baseband processing on IP data from IP gateway 101 and places the IP data onto a channel. In one embodiment, base station 103 is an IEEE 802.16 compliant base station. Optionally, base station 103 may also meet the requirements of WiMax, WiBro, or a similar consortium. In another embodiment, base station 103 is an 800 MHz or 1900 MHz base station. In yet another embodiment, the system is a cellular/PCS system and base station 103 communicates with a base station controller. In still another embodiment, base station 103 communicates with a voice/PSTN gateway. Base station 103 also creates the protocol and modulation type for the channel. Base station 103 then converts the IP packetized data into an analog RF signal for transmission over antenna 108. Base station 103 sends the RF signal to host unit 102. Host unit 102 converts the analog RF signal to a digital serial data stream for long distance high speed transmission over transport mechanism 104, as described in the '828 and '829 applications, for example. Host unit 102 sends the serial data stream over transport mechanism 104, and the stream is received by one or more of remote units 106. Each remote unit 106 converts the received serial data stream back into the original analog RF signal and transmits the signal over its corresponding antenna 108 to consumer mobile devices 110 (for example, a mobile station, fixed wireless modem, or other wireless devices). In some embodiments, the upstream devices, such as base station 103, are a part of a telecommunication-service providers' infrastructure while the downstream devices, such as wireless devices 110, comprise customer premise equipment.

In addition, in some embodiments, the host unit 102 is physically connected to one or more upstream devices 103. In other embodiments, the host unit 102 is communicatively coupled to one or more upstream devices in other ways (for example, using one or more donor antennas and one or more bi-directional amplifiers or repeaters). Furthermore, the DAS 100 may include one or more of the following: filtering, amplification, wave division multiplexing, duplexing, synchronization, and monitoring functionality as needed.

As stated above, remote units 106 have a modular design and defined interfaces that allow components to be removed and installed to adapt to the needs of the service providers. In order to facilitate the removal, installation, and maintenance of the modules in remote units 106, embodiments of the present invention use an enclosure which provides ease of access to the modules. The enclosure also provides a water-resistant seal to protect the modules in outdoor environments.

Figure 2:
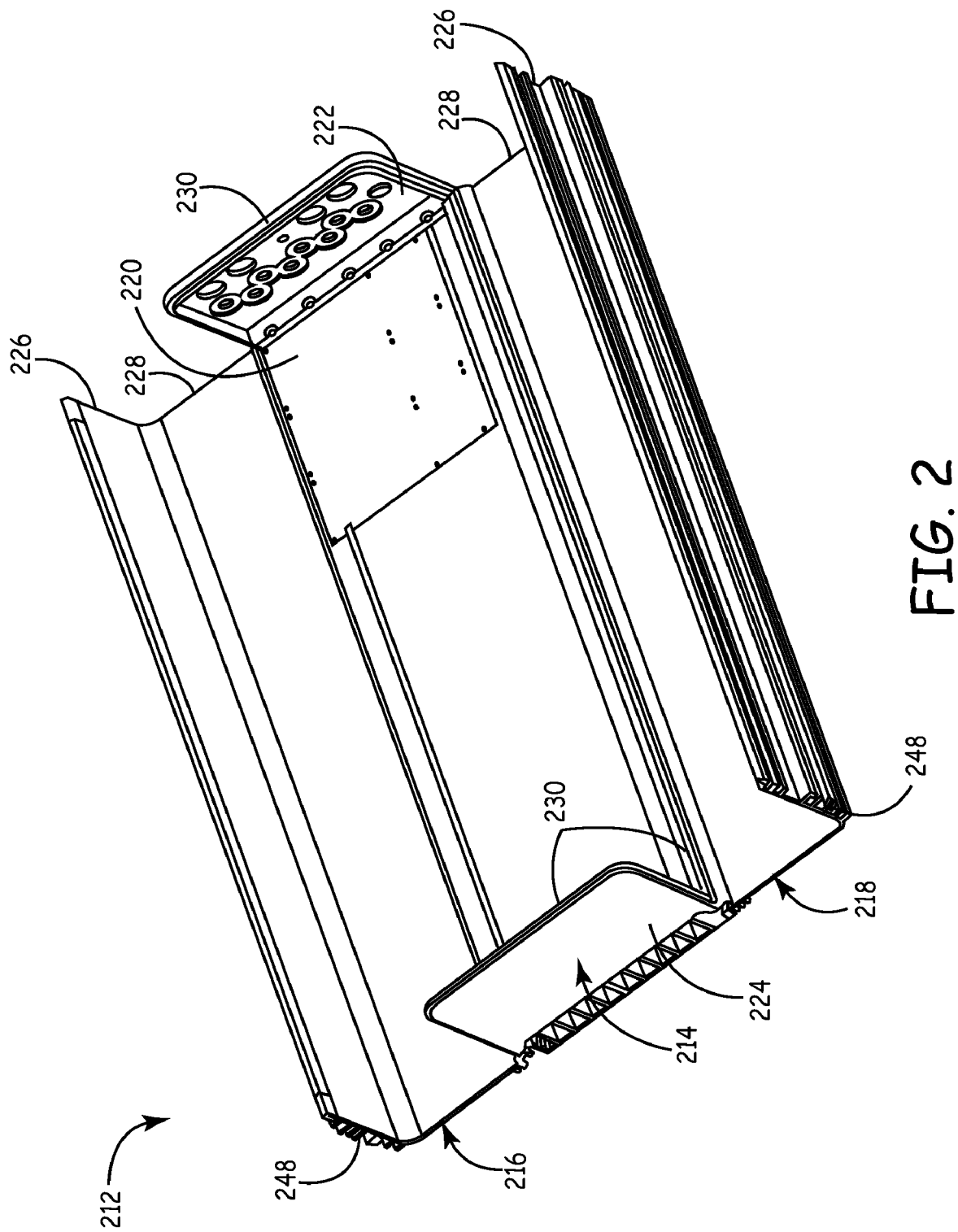
FIG. 2 is an isometric view of an electronics enclosure according to one embodiment of the present invention.

FIG. 2 is a depiction of one exemplary enclosure 212 according to embodiments of the present invention. Enclosure 212 includes a base 214, a first side wall 216, and a second side wall 218. Base 214 is comprised of a back wall 220, a first end plate 222, and a second end plate 224. In some embodiments, back wall 220, first end plate 222, and second end plate 224 are manufactured as separate segments which are then coupled together to from base 214. In other embodiments, back wall 220, first end plate 222 and second end plate 224 are manufactured as one continuous segment. In addition to securing modules in place, back wall 220 is operable to provide a heat sink for electronics modules located in enclosure 212. Similarly, in some embodiments, side walls 216 and 218 are configured with fins 248 to provide additional heat sinks to modules located inside enclosure 212. Consequently, base 214 and side walls 216 and 218 are comprised of any appropriate thermally conductive material for outdoor weather conditions including, but not limited to, metals such as Aluminum and Copper. In particular, in this embodiment, base 214 and side walls 216 and 218 are comprised of Aluminum. In addition, base 214 and/or side walls 216 and 218 are manufactured, in some embodiments, through an extrusion process. Extruding base 214 and side walls 216 and 218 enables the walls and base to be manufactured with varying lengths based on the needs of service providers. In other embodiments, however, other manufacturing processes, such as die casting, are used to manufacture base 214 and side walls 216 and 218.

Figure 9:
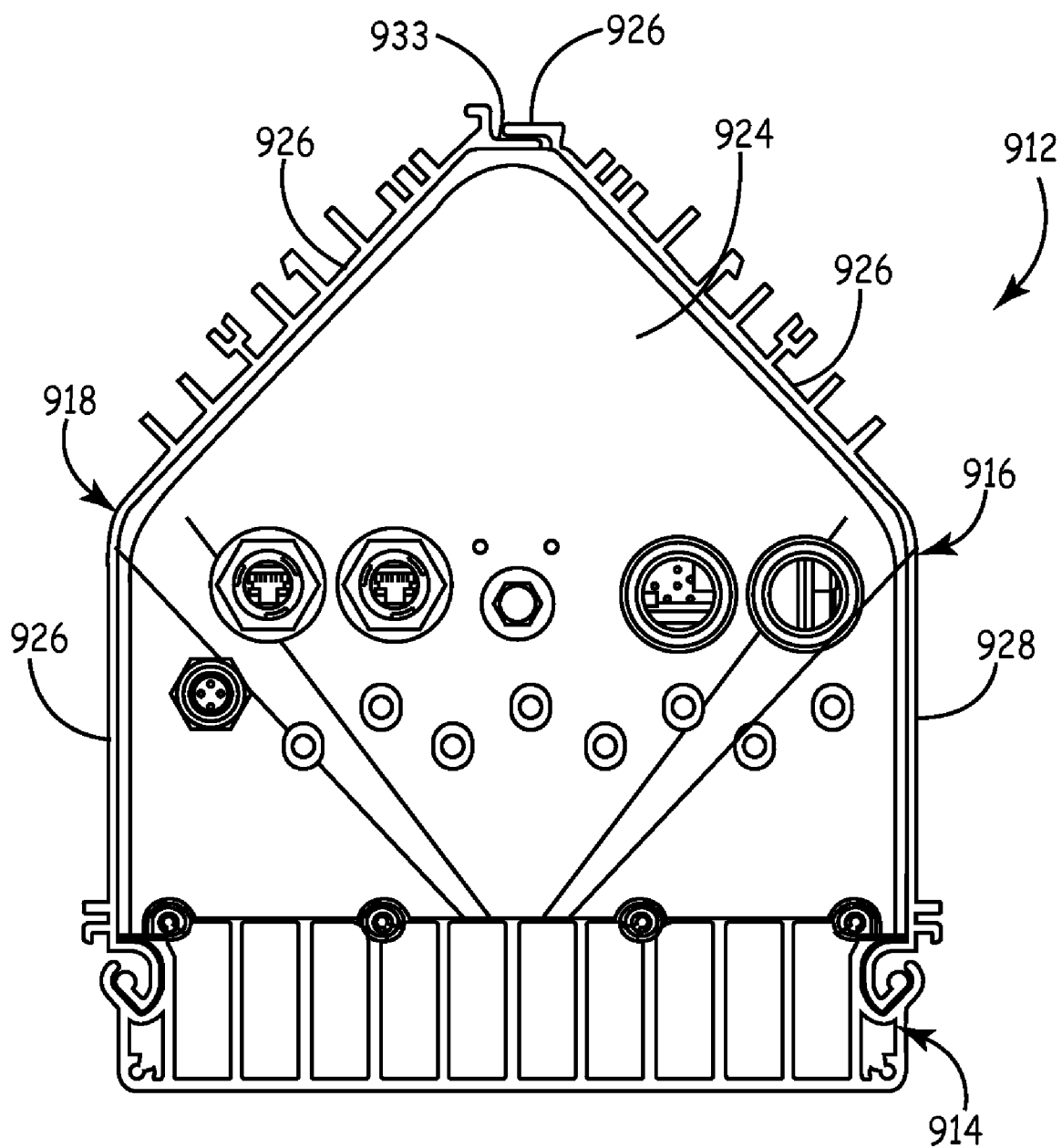
FIG. 9 is a side view of an alternative embodiment of an electronics enclosure.

Each of side walls 216 and 218 is comprised of two sections 226 and 228. Section 226 and 228 together form an angle which matches the shape of first end plate 222 and second end plate 224. In particular, in the example shown in FIG. 2, sections 226 and 228 form an approximately 90 degree angle to match the angle of the substantially rectangular shape of second end plate 224 and first end plate 222. However, it is to be understood that embodiments of the present invention are not to be so limited. For example, in another embodiment, the shape of each of second end plate 224 and first end plate 222 is pentagonal with a 45 degree angle, as shown in FIG. 9. In such an embodiment, sections 226 and 228 of each of side walls 216 and 218 together form a 45 degree angle to match the shape of second end plate 224 and first end plate 222. In this manner, side walls 216 and 218 are able to abut the exposed perimeter of base 214 in order to close the enclosure. As used herein, the exposed perimeter of base 214 refers to the edges of back wall 220, second end plate 224, and first end plate 222 which are exposed when enclosure 212 is opened.

Figure 5A:
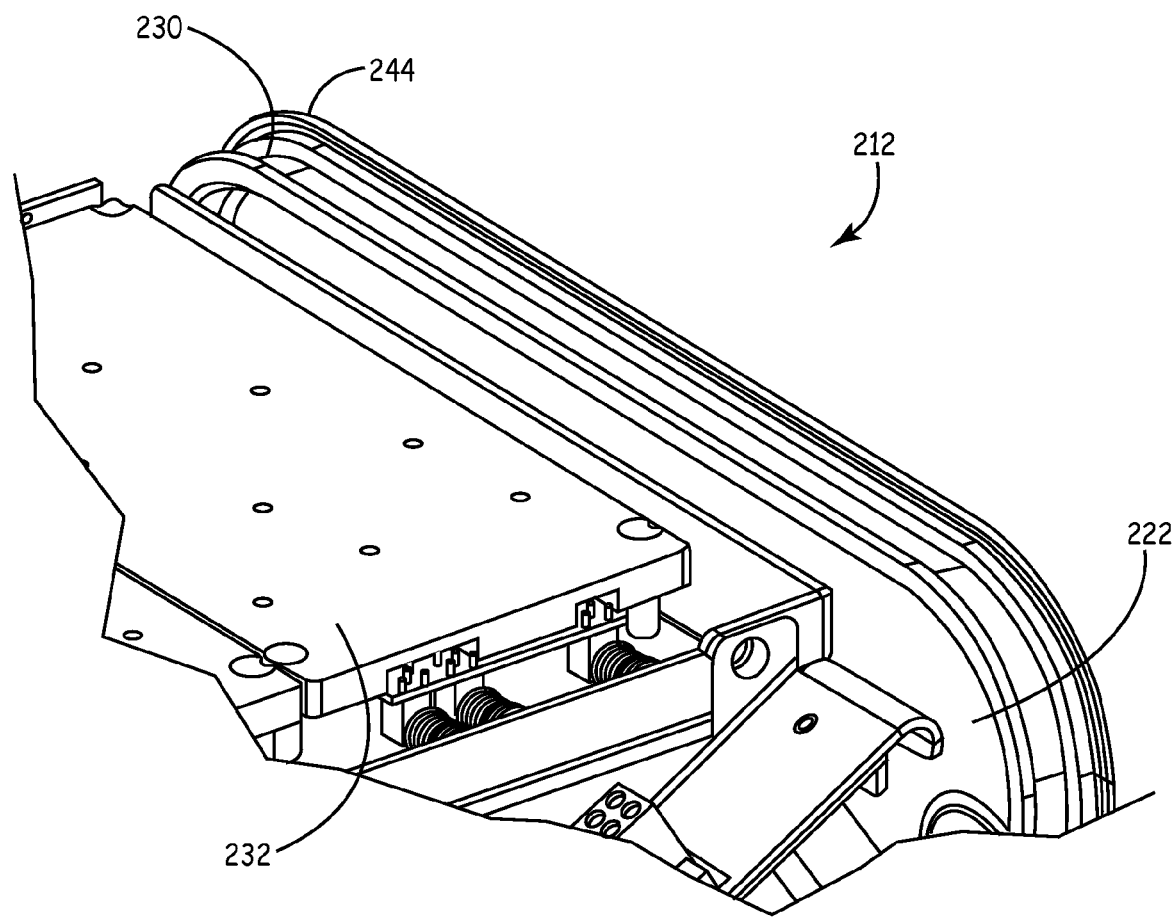
FIGS. 5A-5C are an enlarged view of a portion of an electronics enclosure according to one embodiment of the present invention.

In order to provide a water-resistant seal when closed, enclosure 212 also includes a channel 230 into which is placed a compressible seal. Appropriate materials for the compressible seal include, but are not limited to, solid elastomeric materials (natural rubber, styrene butadiene rubber (SBR), ethylene propylene diene monomer rubber (EPDM), silicone, fluorosilicone, etc), hollow profiles of elastomeric materials, foam elastomeric materials, sponge elastomeric materials, or any similar materials. An enlarged view of channel 230 is shown in FIGS. 5A and 5C. Channel 230 is a continuous channel which extends along the exposed perimeter of base 214. When side walls 216 and 218 are closed, the compressible seal is compressed in the channel to provide the water-resistant seal. The compressible seal is comprised of any appropriate material for providing a water-resistant seal. For example, in one embodiment, the compressible seal is comprised of a silicone foam. In addition, the compressible seal forms a continuous seal around the exposed perimeter of base 214. In one embodiment, the compressible seal is comprised of separate pieces which are bonded together to form one continuous seal. In other embodiments, the compressible seal is manufactured as one continuous piece. Additional details regarding seals used in making enclosure 212 water-resistant can be found in the '1031 and '1032 applications.

Figure 3:
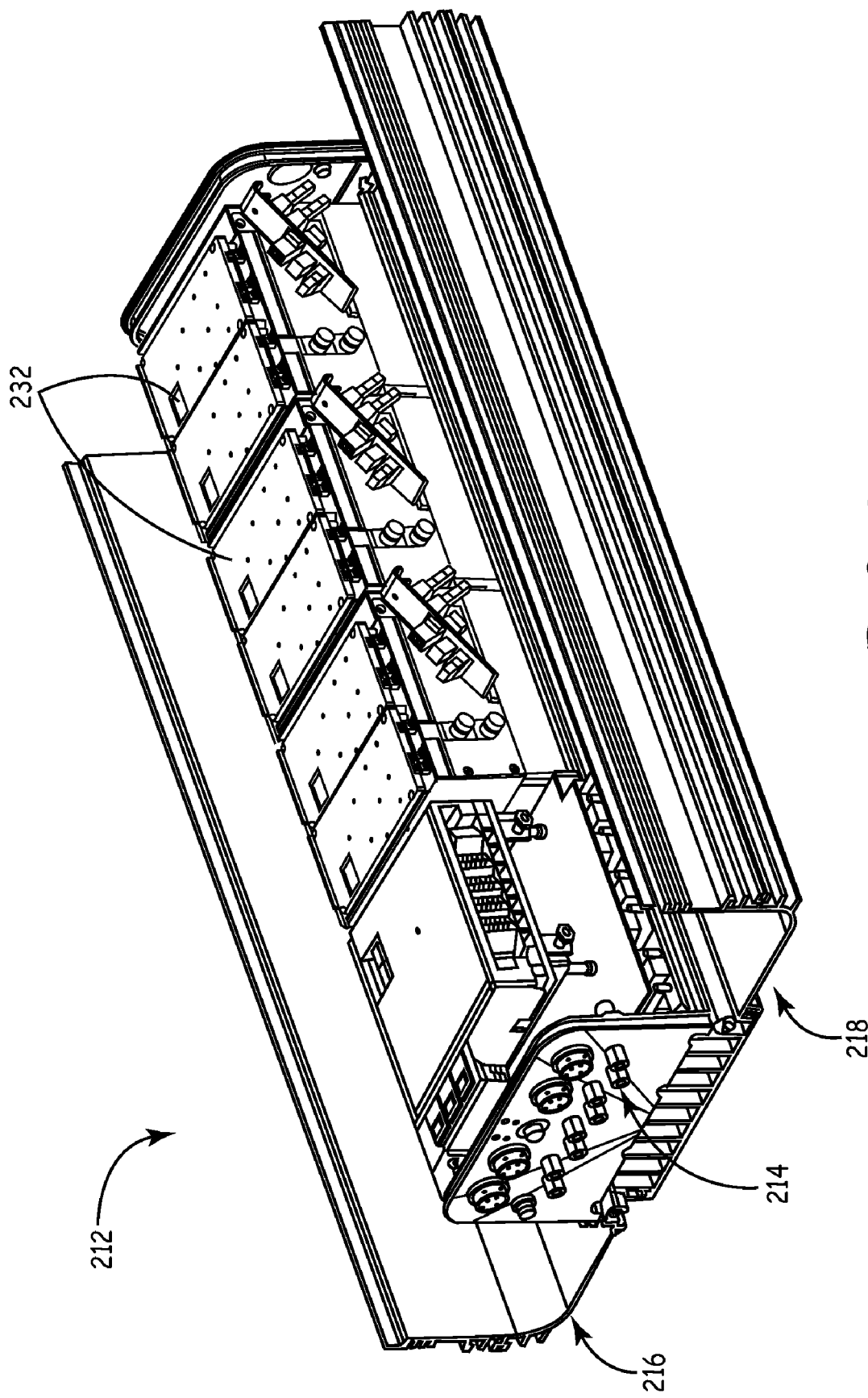
FIG. 3 is another isometric view of an electronics enclosure according to one embodiment of the present invention.
Figure 4A:
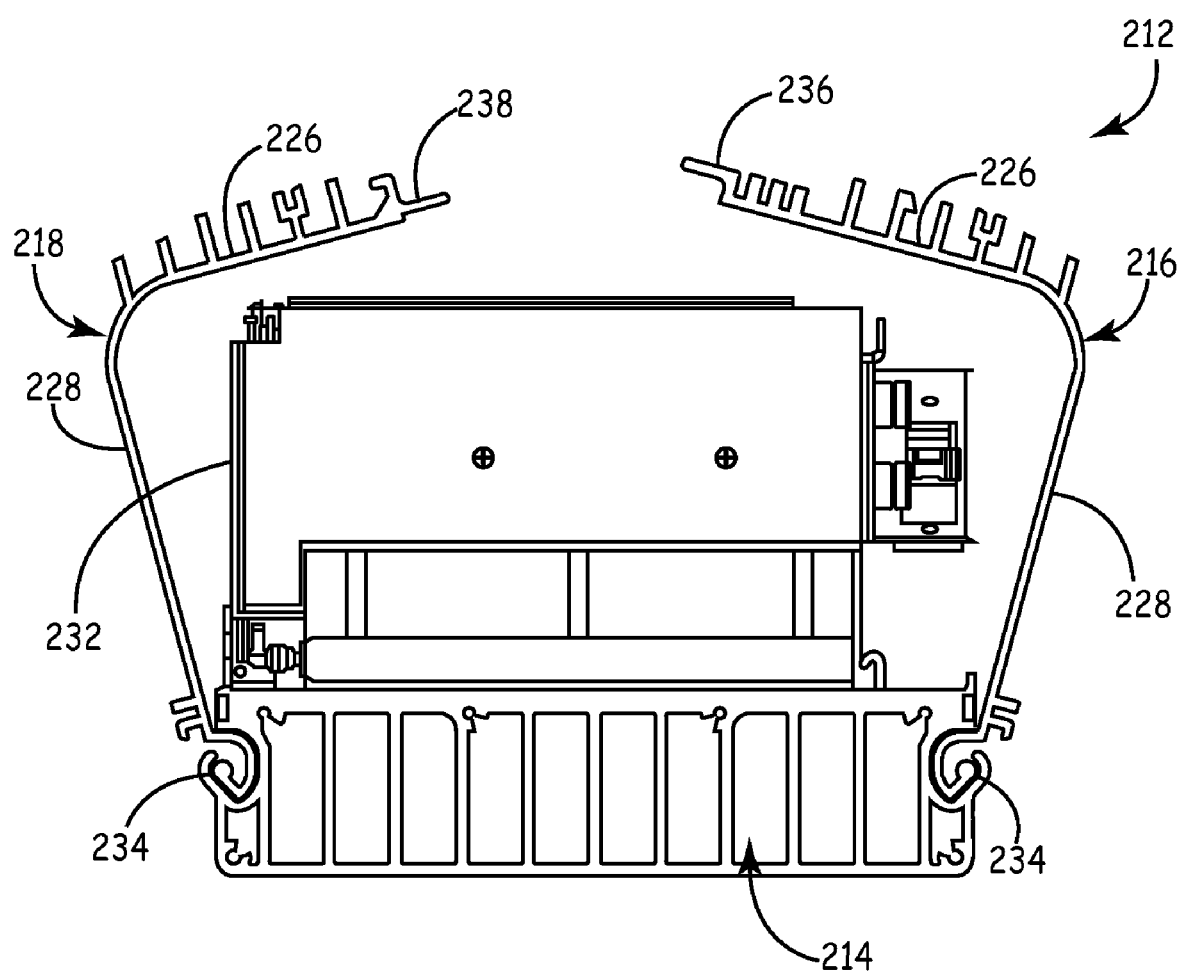
FIGS. 4A and 4B are a top view of an electronics enclosure according to one embodiment of the present invention.
Figure 4B:
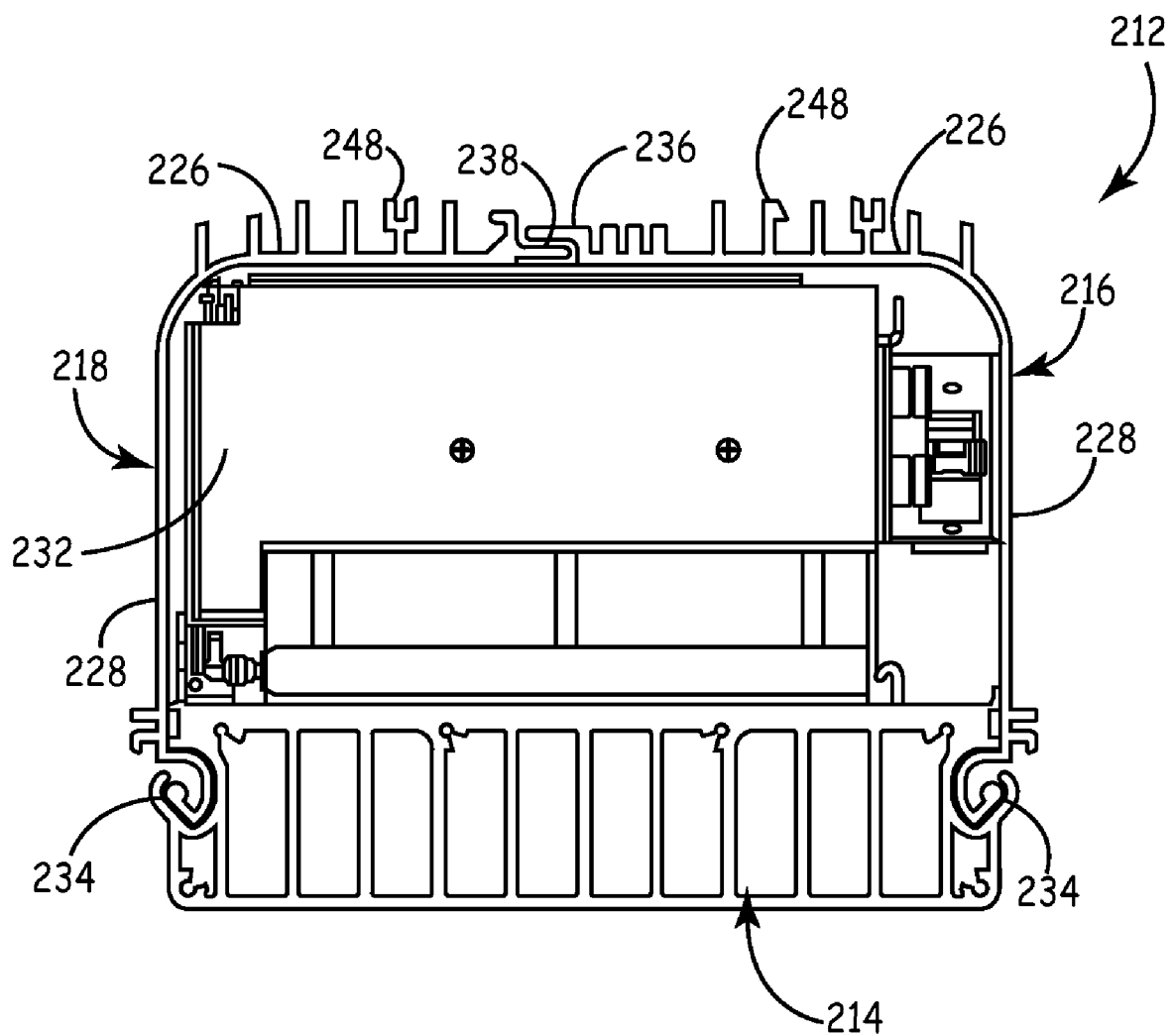

FIG. 3 depicts one embodiment of the enclosure 212 with a plurality of electronic modules 232 disposed inside the enclosure 212. As discussed above, embodiments of the present invention utilize modules 232 to make technology and frequency band adjustments by simply replacing the modules 232. As shown in FIG. 4A, side walls 216 and 218 rotate toward the center of base 214 to enclose modules 232. Notably, FIGS. 4A and 4B do not show second end plate 224 or first end plate 222 in order to provide a view of modules 232 inside enclosure 212. When closed, as shown in FIG. 4B sections 226 and 228 of each of side walls 216 and 218 contact the sides of modules 232. When comprised of a thermo-conductive material, side walls 216 and 218 are able to provide an additional heat sink for modules 232. In addition, side walls 216 and 218 compress modules 232 against back wall 220 to improve the performance of back wall 220 as a heat sink for modules 232.

FIG. 4A also shows one embodiment of hinges 234 which enable side walls 216 and 218 to rotate toward the center of base 214 when closing enclosure 212 and to rotate away from the center of base 214 when opening enclosure 212. As shown in FIG. 4, hinges 234 are formed as part of each of side walls 216 and 218. By manufacturing side walls 216 and 218 as one piece, costs of production are reduced. In addition, the continuous hinge 234 provides improved electromagnetic interference (EMI) shielding since there are no slits or gaps between hinges 234 and side walls 216 and 218 through which EMI can pass. Additional details regarding one embodiment of hinges 234 are described in the '1037 application.

Additionally, FIG. 4B shows lip 238 of side wall 218 and lip 236 of side wall 216. Lips 238 and 236 enable side walls 216 and 218 to interconnect when in the closed position. This interconnection improves the water-resistant seal of enclosure 212. For example, a compressible seal is placed between lips 236 and 238, in some embodiments. In addition, by overlapping, lips 236 and 238 eliminate a direct path in the seam between side walls 216 and 218 through which EMI could travel. By eliminating the direct path, EMI shielding is improved.

Figure 5B:
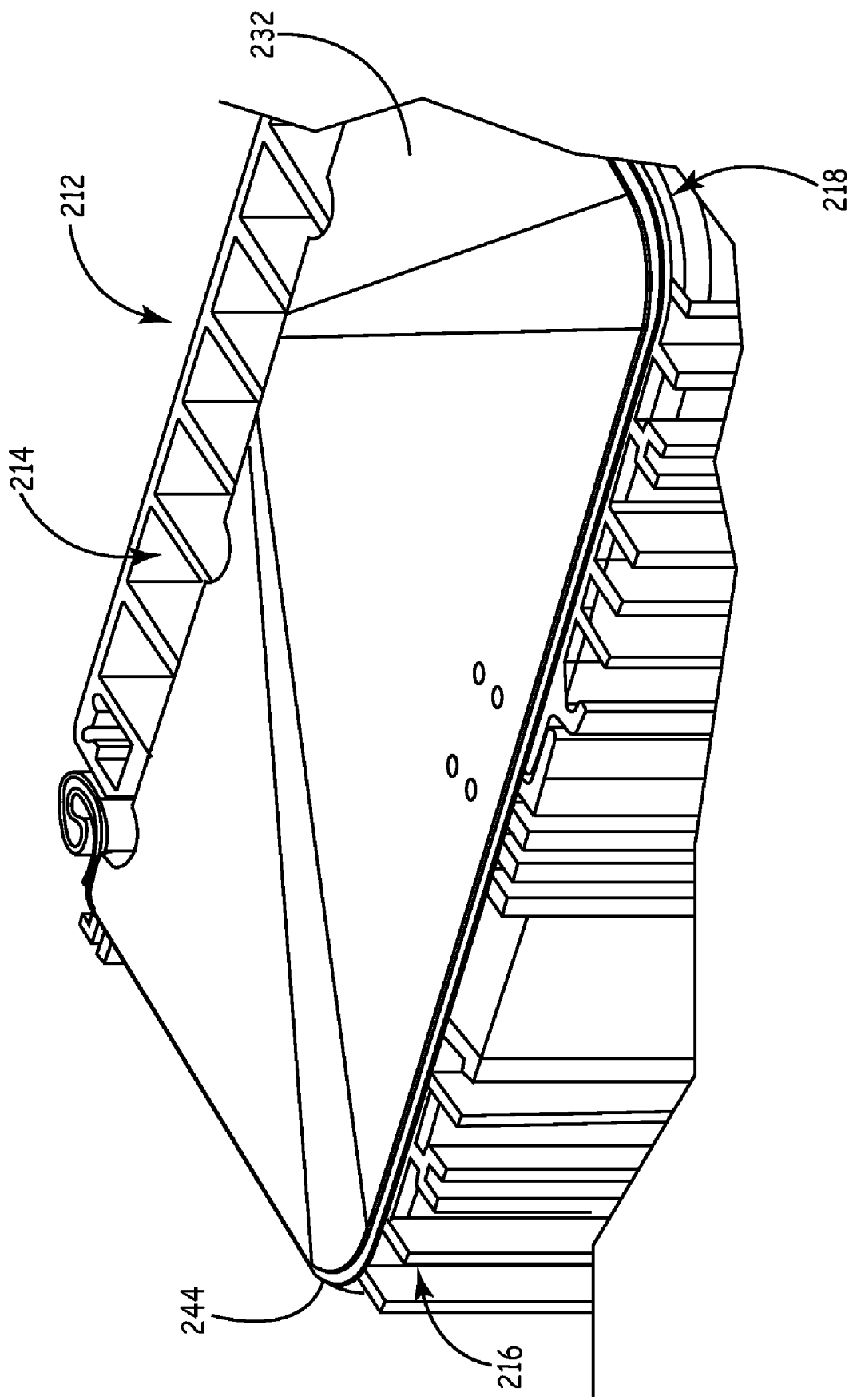
Figure 5C:
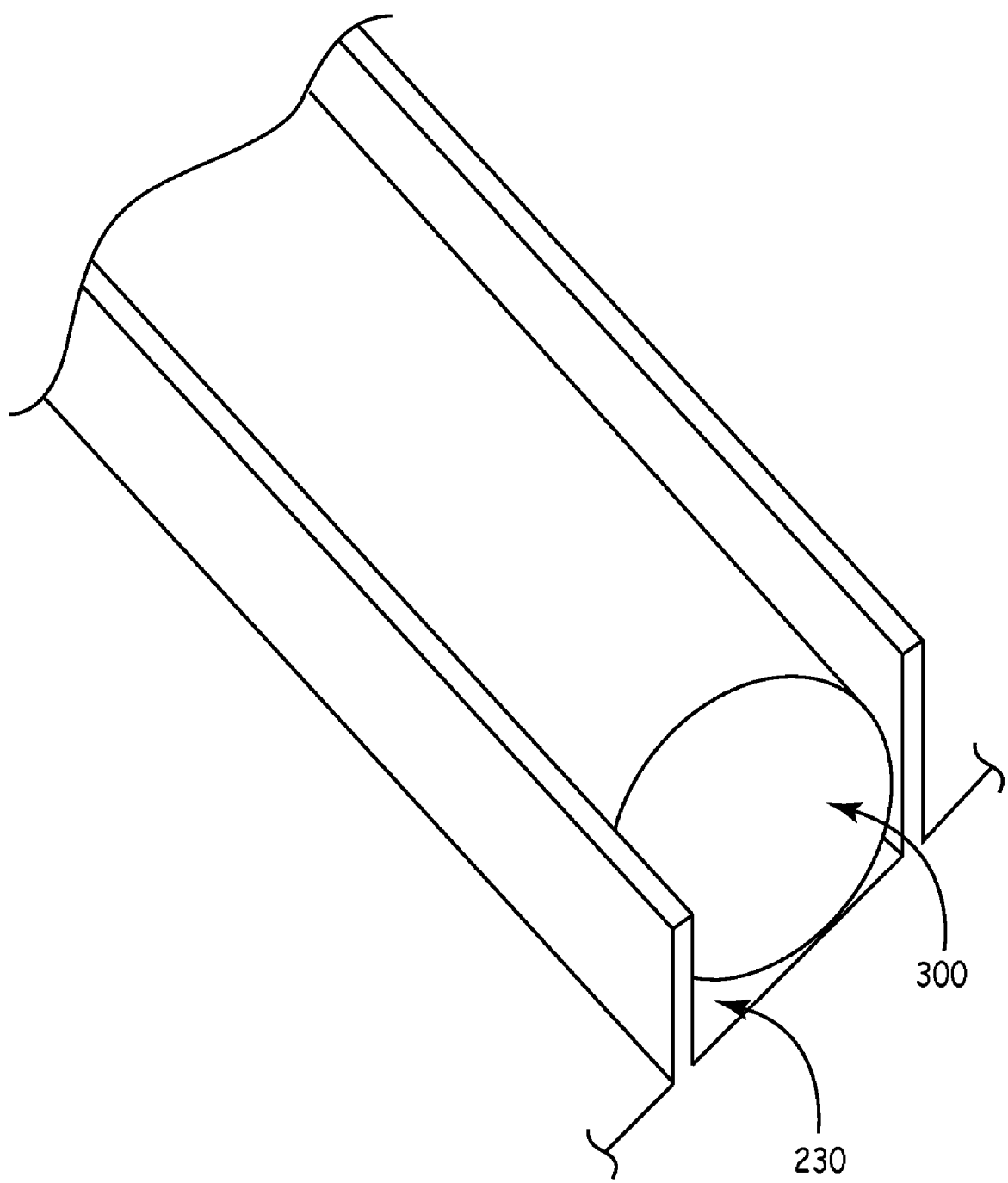

Some embodiments of enclosure 212 also include a drip cap 244 on one or more of first end plate 222 and second end plate 224 as shown in FIGS. 5A and 5B. Drip cap 244 is an outer ridge which extends to the side of side walls 216 and 218 when in the closed position, as shown in FIG. 5B. Drip cap 244, thus, provides additional protection against rain water by covering the seam between base 214 and side walls 216 and 218. In addition, drip cap 244 improves EMI shielding by covering with metal the seam between base 214 and side walls 216 and 218. In this way, there is no direct line for EMI to travel through the seam which results in improved EMI shielding.

Figure 6:
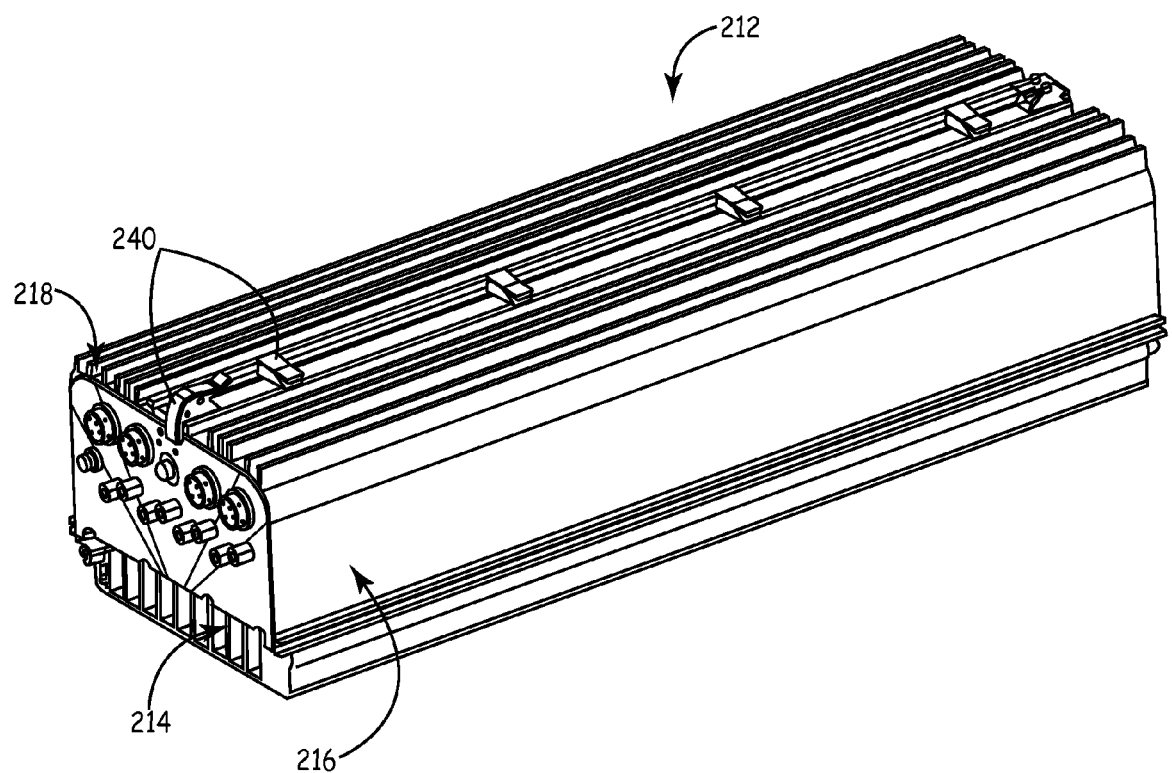
FIG. 6 is an isometric view of a closed electronics enclosure according to one embodiment of the present invention.

FIG. 6 depicts the enclosure 212 in the closed position. As shown in FIG. 6, enclosure 212 further includes a locking mechanism 240. In this embodiment, locking mechanism 240 is implemented as latches along the seams between side walls 216 and 218 and along the seam between base 214 and side walls 216 and 218. Latches 240 secure the enclosure 214 in the closed position and compress the compressible seal in channel 230 by exerting pressure on side walls 216 and 218.

Figure 7B:
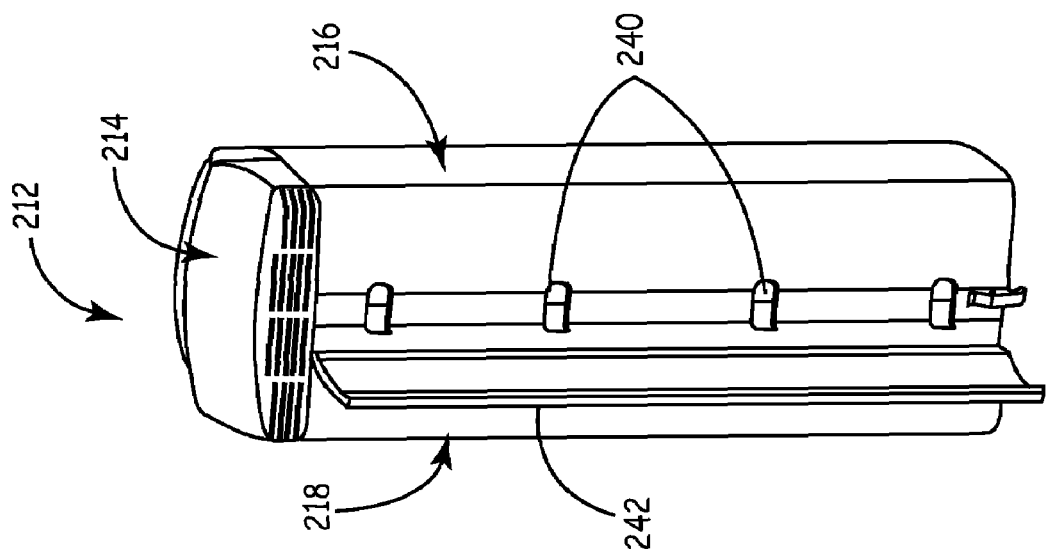
FIGS. 7A-7C are isometric views of an electronics enclosure having a latch cover according to one embodiment of the present invention.
Figure 7A:
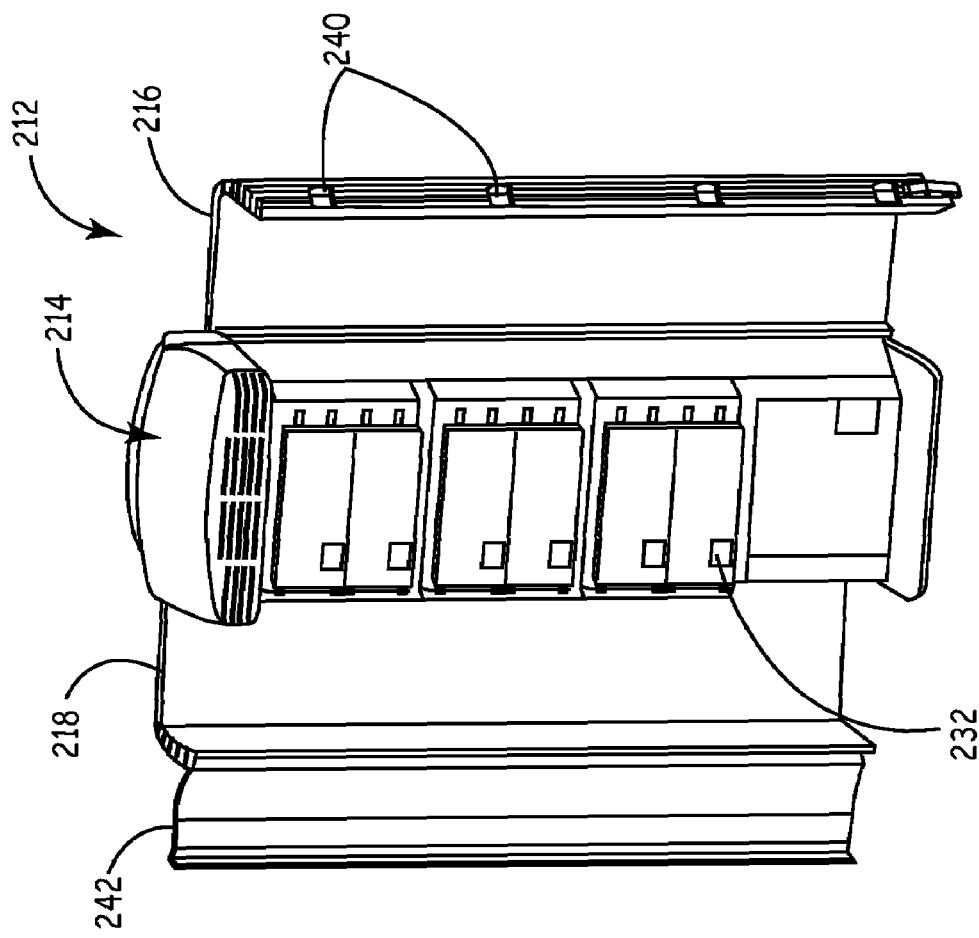
Figure 7C:
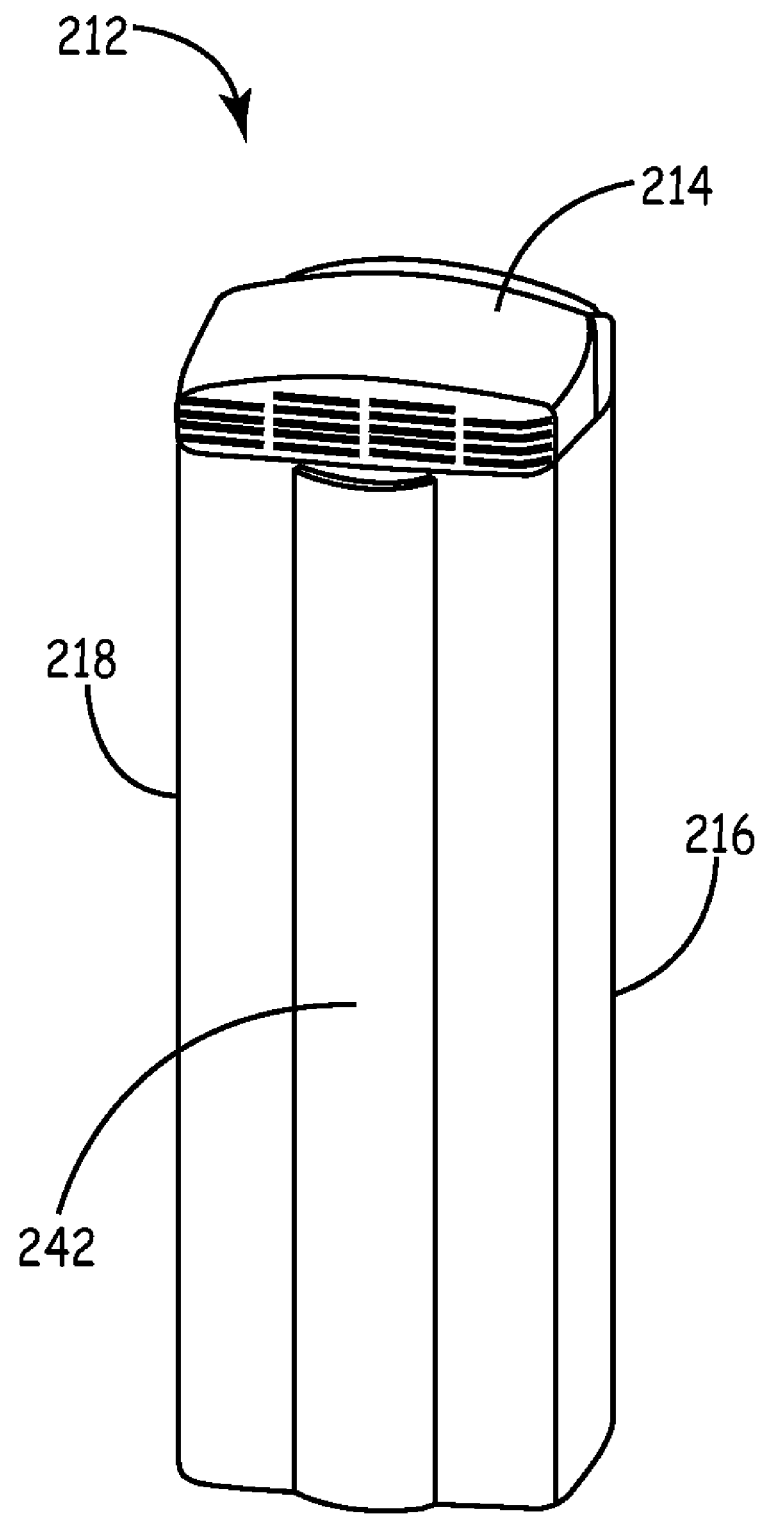

In addition, in some embodiments, enclosure 212 includes a latch cover 242, as shown in FIGS. 7A-7C. FIG. 7A shows enclosure 212 in an open position. As shown in FIG. 7A, a latch cover 242 is coupled to side wall 218, whereas latches 240 are coupled to side wall 216. When in the closed position latches 240 secure the side walls 216 and 218 in place as shown in FIG. 7B. Then, as shown in FIG. 7C, latch cover 242 is rotated to cover latches 240. This provides additional protection from rain water as well as prevent the accidental loosening of latches 240. Such accidental loosening can occur, for example, when clothes become caught on one or more of latches 240.

Figure 8:
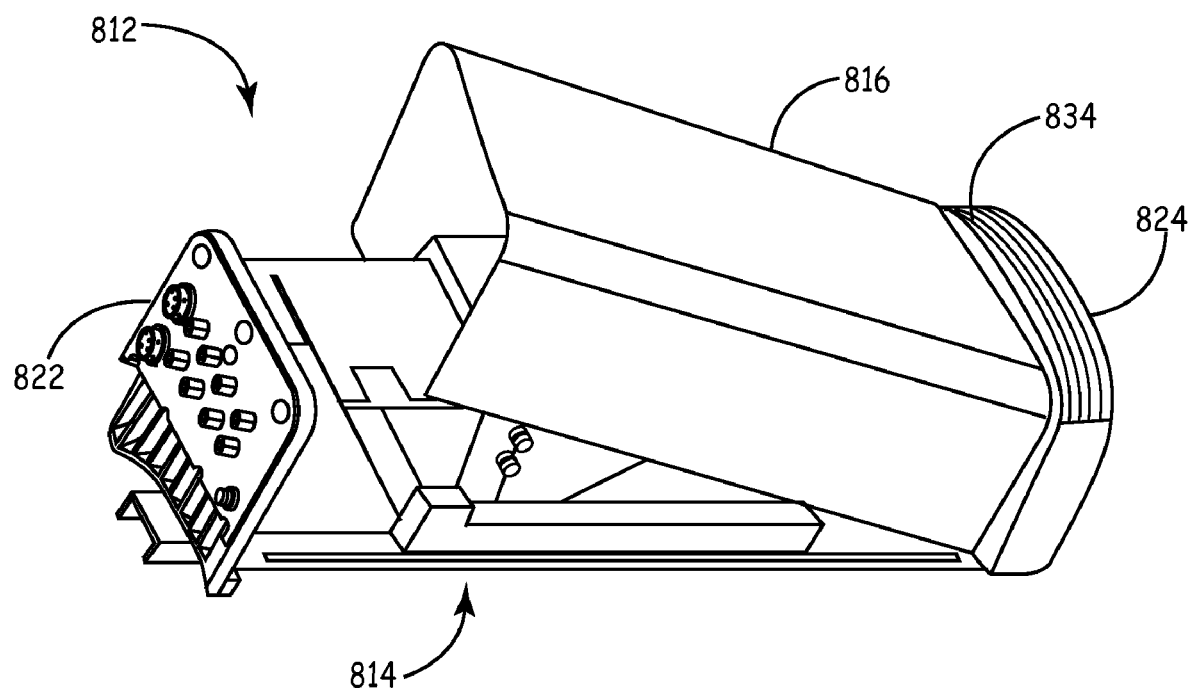
FIG. 8 is an isometric view of an alternative embodiment of an electronics enclosure.

In an alternative embodiment, enclosure 812 comprises a U-shaped side wall 846 rather than side walls 216 and 218 as shown in FIG. 8. In FIG. 8, U-shaped side wall 846 is coupled to base 814 at second end plate 824. However, it is to be understood that U-shaped side wall 846 can be coupled to first end plate 822, in other embodiments. U-shaped side wall 846 rotates about hinge 834 to close or open enclosure 812. Hinge 834 is implemented in this embodiment similar to hinge 234 described above. Hence, U-shaped side wall 846 also provides easy access to three sides of modules enclosed in enclosure 812.

Hence, embodiments of the present invention enable easy access to modules located inside an electronics enclosure. In particular, this enables easier maintenance and installation of remote units in a distributed antenna system, such as DAS 100 described above. In addition, the easy access is provided while maintaining and/or improving EMI shielding and the water-resistant seal of remote units as compared to conventional remote unit enclosures. Finally, enclosures of the present invention reduce manufacturing costs by enabling the use of extrusion processes to manufacture the side walls and base as compared to conventional enclosures which use rigid components not conducive to extrusion processes.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An electronics enclosure comprising:
   a base operable to secure one or more electronic components in place; the base comprising:
      a back wall to which the electronic components are secured;
      a first end plate extending from a first end of the back wall; and
      a second end plate extending from a second end of the back wall;
   a first side wall coupled to a first side of the base and operable to rotate between an open position and a closed position;
   a second side wall coupled to a second side of the base and operable to rotate between an open position and a closed position;
   wherein each of the first and second side walls comprise a first section and a second section which form an angle such that, when in the closed position, the first and second side walls interconnect with each other and together abut the exposed perimeter of the first end plate, the second end plate and the back wall to enclose the one or more electronic components; and
   wherein, when interconnected and abutting the first end plate, the second end plate and the back wall, each of the first and second side walls press against the one or more electronic components to improve the heat sink performance of the first and second side walls.

2. The electronics enclosure of claim 1, wherein the first and second sections of each of the first and second side walls form an approximately 90 degree angle.

3. The electronics enclosure of claim 1, wherein the first and second side walls rotate about a hinge.

4. The electronics enclosure of claim 1, wherein the first and second side walls, the first end plate, the second end plate, and the back wall are each comprised of aluminum.

5. The electronics enclosure of claim 1, wherein, when interconnected and abutting the first end plate, the second end plate and the back wall, each of the first and second side walls press the one or more electronic components against the back wall to improve the heat sink performance of the back wall.

6. The electronics enclosure of claim 5, wherein each of the first and second side walls further comprises one or more fins to improve the heat sink performance of the first and second side walls for the one or more electronic components.

7. The electronics enclosure of claim 1, further comprising a plurality of latches operable to secure the first and second side walls together and against the perimeter of the first end plate, the second end plate, and the back wall.

8. The electronics enclosure of claim 7, wherein one or more of the plurality of latches is coupled to an end of the first side wall.

9. The electronics enclosure of claim 8, wherein the second side wall further comprises a latch cover configured to cover the one or more latches coupled to an end of the first side wall.

10. The electronics enclosure of claim 1, further comprising:
    a continuous channel which extends along the exposed perimeter of the first end plate, the second end plate, and the back wall; and
    a compressible seal disposed within the continuous channel such that the first and second side walls abut the continuous seal, when in the closed position, to form an impermeable enclosure.

11. A communications system remote unit comprising:
one or more electronic components; and
an enclosure operable to enclose the one or more electronic components, wherein the enclosure comprises:
a base operable to secure one or more electronic components in place;
a first side wall coupled to a first side of the base and operable to rotate between an open position and a closed position;
a second side wall coupled to a second side of the base and operable to rotate between an open position and a closed position;
wherein each of the first and second side walls comprise a first section and a second section which form an angle such that, when in the closed position, the first and second side walls interconnect with each other and together abut the exposed perimeter of the base to enclose the one or more electronic components; and
wherein, when interconnected and abutting the first end plate, the second end plate and the back wall, each of the first and second side walls press against the one or more electronic components to improve the heat sink performance of the first and second side walls.

12. The communications system remote unit of claim 11, wherein the one or more electronic components are radio frequency (RF) modules.

13. The communications system remote unit of claim 11, wherein the first and second sections of each of the first and second side walls form an approximately 90 degree angle.

14. The communications system remote unit of claim 11, wherein the first and second side walls rotate about a hinge.

15. The communications system remote unit of claim 11, wherein the first and second side walls and the base are each comprised of aluminum.

16. The communications system remote unit of claim 11, wherein, when interconnected and abutting the base, each of the first and second side walls press the one or more electronic components against a back wall of the base to improve the heat sink performance of the back wall.

17. The communications system remote unit of claim 16, wherein each of the first and second side walls further comprises one or more fins to improve the heat sink performance of the first and second side walls for the one or more electronic components.

18. The communications system remote unit of claim 11, further comprising a plurality of latches operable to secure the first and second side walls together and against the perimeter of the base.

19. The communications system remote unit of claim 18, wherein one or more of the plurality of latches is coupled to an end of the first side wall.

20. The communications system remote unit of claim 19, wherein the second side wall further comprises a latch cover configured to cover the one or more latches coupled to an end of the first side wall.

21. The communications system remote unit of claim 11, further comprising:
a continuous channel which extends along the exposed perimeter of the base; and
a compressible seal disposed within the continuous channel such that the first and second side walls abut the continuous seal, when in the closed position, to form an impermeable enclosure.

22. A distributed antenna system comprising:
a host unit;
a transport mechanism; and
at least one remote unit communicatively coupled to the host unit via the transport mechanism;
wherein each of the host unit and the at least one remote unit are operable to receive a radio frequency (RF) signal and transport the received RF signal over the transport mechanism; wherein each of the at least one remote units comprises:
one or more electronic components; and
an enclosure operable to enclose the one or more electronic components, wherein the enclosure comprises:
a base operable to secure one or more electronic components in place;
a first side wall coupled to a first side of the base and operable to rotate between an open position and a closed position;
a second side wall coupled to a second side of the base and operable to rotate between an open position and a closed position; and
wherein each of the first and second side walls comprise a first section and
a second section which form an angle such that, when in the closed position, the first and second side walls interconnect with each other and together abut the exposed perimeter of the base to enclose the one or more electronic components.

23. The distributed antenna system of claim 22, wherein the one or more electronic components are radio frequency (RF) modules.

24. The distributed antenna system of claim 22, wherein the first and second sections of each of the first and second side walls form an approximately 90 degree angle.

25. The distributed antenna system of claim 22, wherein the first and second side walls rotate about a hinge.

26. The distributed antenna system of claim 22, wherein the first and second side walls and the base are each comprised of aluminum.

27. The distributed antenna system of claim 22, wherein, when interconnected and abutting the base, each of the first and second side walls press the one or more electronic components against a back wall of the base to improve the heat sink performance of the back wall.

28. The distributed antenna system of claim 27, wherein each of the first and second side walls further comprises one or more fins to improve the heat sink performance of the first and second side walls for the one or more electronic components.

29. The distributed antenna system of claim 22, further comprising a plurality of latches operable to secure the first and second side walls together and against the perimeter of the base.

30. The distributed antenna system of claim 29, wherein one or more of the plurality of latches is coupled to an end of the first side wall.

31. The distributed antenna system of claim 30, wherein the second side wall further comprises a latch cover configured to cover the one or more latches coupled to an end of the first side wall.

32. The distributed antenna system of claim 22, further comprising:
a continuous channel which extends along the exposed perimeter of the base; and
a compressible seal disposed within the continuous channel such that the first and second side walls abut the continuous seal, when in the closed position, to form an impermeable enclosure.

33. An electronics enclosure comprising:
a base operable to secure one or more electronic components in place; the base comprising:

a back wall to which the electronic components are secured;

a first end plate extending from a first end of the back member; and a second end plate extending from a second end of the back member;

a U-shaped side wall coupled to one of the first end plate and the second end plate, the U-shaped side wall operable to rotate between an open position and a closed position;

wherein, when in the closed position, the U-shaped side wall abuts the exposed perimeter of the first end plate, the second end plate and the back wall to enclose the one or more electronic components; and wherein, when interconnected and abutting the first end plate, the second end plate and the back wall, the U-shaped side wall presses against the one or more electronic components to improve the heat sink performance of the U-shaped side wall.

34. The electronics enclosure of claim 33, further comprising:

a continuous channel which extends along the exposed perimeter of the base; and a compressible seal disposed within the continuous channel such that the U-shaped side wall abuts the continuous seal, when in the closed position, to form an impermeable enclosure.

* * * * *